United States Patent
Pichai et al.

(10) Patent No.: US 10,888,027 B1
(45) Date of Patent: Jan. 5, 2021

(54) COOLING UNIT CONTROL

(71) Applicant: Equinix, Inc., Redwood City, CA (US)

(72) Inventors: Tikhon Suresh Pichai, Simpsonville, SC (US); David Lyle Smith, Hagerstown, MD (US)

(73) Assignee: Equinix, Inc., Redwood City, CA (US)

( * ) Notice: Subject to any disclaimer, the term of this patent is extended or adjusted under 35 U.S.C. 154(b) by 424 days.

(21) Appl. No.: 15/358,055

(22) Filed: Nov. 21, 2016

(51) Int. Cl.
*H05K 7/00* (2006.01)
*H05K 7/20* (2006.01)

(52) U.S. Cl.
CPC ..... *H05K 7/20745* (2013.01); *H05K 7/20754* (2013.01); *H05K 7/20836* (2013.01)

(58) Field of Classification Search
CPC .............. H05K 7/20836; H05K 7/20754
See application file for complete search history.

(56) References Cited

U.S. PATENT DOCUMENTS

| 2011/0046790 A1* | 2/2011 | Miller .................... | H04L 67/125 700/276 |
| 2012/0234527 A1* | 9/2012 | Murayama ............. | G05D 22/02 165/287 |
| 2012/0310420 A1* | 12/2012 | Quirk ................. | G05D 23/1934 700/278 |

OTHER PUBLICATIONS

"Keeping Cool with Outdoor Air . . . Airside Economizers," Trane Engineers Newsletter, vol. 35-2, May 2006, 8pp.

STY, "Humidity Control in Data Centers Using Air Side Economizers," Industry Perspectives, datacenterknowledge.com, Jun. 3, 2014, 3 pp.
"Standard Sequences of Operation Guideline: Air Handling Units—Variable Air Volume," The Pennsylvania State Univ., Dec. 3, 2010, 24 pp.
"Installation, Operation and Maintenance Manual for C-TRAC3 Cooling Controller," Engineered Air, Jan. 2013, 21 pp.
Zhou et al., "Airside Economizer—Comparing Different Control Strategies and Common Misconceptions," Proceeding of the Eighth International Conference for Enhanced Building Operations, Oct. 2008, 5 pp.

* cited by examiner

*Primary Examiner* — Elizabeth J Martin
*Assistant Examiner* — Nael N Babaa
(74) *Attorney, Agent, or Firm* — Shumaker & Sieffert, P.A.

(57) ABSTRACT

A method includes, at a start time, controlling a cooling unit to start the cooling unit in a mechanical mode and controlling the cooling unit to transition, after waiting a waiting interval from the start time and over a transition interval, the cooling unit from the mechanical mode to an economizer mode. In the mechanical mode, the cooling unit receives return air, cools the return air, and releases the cooled return air as supply air. The supply air is air supplied to a cooled volume. In the economizer mode, the cooling unit receives outdoor air and releases the outdoor air as at least a portion of the supply air. Transitioning the cooling unit from the mechanical mode to the economizer mode includes transitioning, over the transition interval, from receiving only the return air to receiving progressively less of the return air and progressively more of the outdoor air.

20 Claims, 5 Drawing Sheets

COOLING UNIT CONTROL

TECHNICAL FIELD

The invention relates to managing air temperatures within a data center.

BACKGROUND

A facility such as a data center includes a data center storage volume housing numerous electronic devices that produce heat, including network, server, and storage gear, as well as power distribution units for distributing power to devices within the facility. A cooling unit may be used to supply a cool air stream into the storage volume. Warm exhaust produced by electronic devices within the storage volume may be returned to the cooling unit as return air for cooling and recirculation within the storage volume. Alternatively or in addition, cool outside air may be supplied by the cooling unit to the storage volume. This return, cooling, and recirculation of air within the facility and/or the supply of cool air into the facility may help to keep the air within the storage volume cool to maintain safety, performance, and reliability of the electronic devices within the storage volume.

SUMMARY

In general, techniques are described for controlling a cooling unit to efficiently cool a data center storage volume using one or more of a mechanical mode in which the cooling unit supplies only cooled, recirculated air to the data center storage volume and an economizer mode in which the cooling unit supplies cool outdoor air to the data center storage volume, alone or in addition to cooled recirculated air. For example, a system may control the cooling unit to start the cooling unit in the mechanical mode and waits for a wait interval to allow humidifier media of the cooling unit to become sufficiently saturated to support switching to the economizer mode. After the wait interval, the system transitions the cooling unit from the mechanical mode to the economizer mode over a transition interval by using progressively more outside air and progressively less cooled and recirculated air. When the economizer uses all (100%) of outside air and no (0%) recirculated air, it is considered to be in a full economizer mode; when utilizing the code-mandated minimum amount of outside air and recirculated air, it is considered to be in full mechanical cooling mode; at other proportions of outside air and recirculated air, the system is considered to be in partial economization mode. The system may monitor humidity levels of the supply air and or data center space and stop transitioning to ensure data center humidity levels within a predefined control range. The system may continue to monitor the humidity of the supply air and/or data center space and may switch to using more cooled recirculated return air and less outdoor air based on a humidity level in the data center approaching the limits of the desired humidity range as indicated by the continuously monitored humidity measurements. This system may in this way efficiently and cost-effectively make use of an economizer mode that uses cool outdoor air without sacrificing the necessary humidity levels that must be maintained in the data center storage volume.

In one example, a method includes, at a start time, controlling a cooling unit to start the cooling unit in a mechanical mode and controlling the cooling unit to transition, after waiting a waiting interval from the start time and over a transition interval, the cooling unit from the mechanical mode to an economizer mode. In the mechanical mode, the cooling unit receives return air, cools the return air, and releases the cooled return air as supply air. The supply air is air supplied to a cooled volume. In the economizer mode, the cooling unit receives outdoor air and releases the outdoor air as at least a portion of the supply air. Transitioning the cooling unit from the mechanical mode to the economizer mode includes transitioning, over the transition interval, from receiving only the return air to receiving progressively less of the return air and progressively more of the outdoor air.

In another example, a system includes a cooling unit, comprising a humidifier, and a computing device. The computing device is configured to, at a start time, control the cooling unit to start the cooling unit in a mechanical mode and control the cooling unit to transition, after waiting a waiting interval from the start time and over a transition interval, the cooling unit from the mechanical mode to an economizer mode. In the mechanical mode, the cooling unit receives return air, cools the return air, and releases the cooled return air as supply air. The supply air is air supplied to a cooled volume. In the economizer mode, the cooling unit receives outdoor air and releases the outdoor air as at least a portion of the supply air. Transitioning the cooling unit from the mechanical mode to the economizer mode includes transitioning, over the transition interval, from receiving only the return air to receiving progressively less of the return air and progressively more of the outdoor air.

In a further example, a system includes a data center storage volume comprising a cooled volume, a cooling unit comprising a humidifier, and a computing device. The computing device is configured to, at a start time, control the cooling unit to start the cooling unit in a mechanical mode and control the cooling unit to transition, after waiting a waiting interval from the start time and over a transition interval, the cooling unit from the mechanical mode to an economizer mode. In the mechanical mode, the cooling unit receives return air, cools the return air, and releases the cooled return air as supply air. The supply air is air supplied to the cooled volume. In the economizer mode, the cooling unit receives outdoor air and releases the outdoor air as at least a portion of the supply air. Transitioning the cooling unit from the mechanical mode to the economizer mode includes transitioning, over the transition interval, from receiving only the return air to receiving progressively less of the return air and progressively more of the outdoor air.

The details of one or more examples are set forth in the accompanying drawings and the description below. Other features, objects, and advantages of the disclosure will be apparent from the description and drawings, and from the claims.

BRIEF DESCRIPTION OF DRAWINGS

Like reference characters denote like elements throughout the figures and text.

DETAILED DESCRIPTION

A data center may store numerous electronic devices that produce heat, including the network, server, and storage gear, as well as power distribution units (PDUs) for distributing power to devices within the facility.

A data center may employ a cooling air supply system delivering the cooling air as a horizontal stream, or a vertical downflow from a ceiling or a higher level, or as vertical upflow from a raised floor, for cooling electronic devices within the data center. Servers and other equipment may pull cool air from streams of cool air in cold aisles as needed and discharge warm server exhaust into contained hot aisles. The warm server exhaust may be returned to a cooling unit as return air for cooling and recirculation in cool air streams in the cold aisles. Alternatively or in addition, cool outdoor air may be supplied as a portion of the cool air streams supplied by the cooling unit to the cold aisles. This design may be most efficient and effective when air velocities are low and mixing of the cool air and warm exhaust is minimized.

In some cases, abruptly switching from a mechanical mode, in which a cooling unit supplies exclusively cooled and recirculated air to the cold aisles, to an economizer mode in which the cooling unit also supplies cool outdoor air to the cold aisles, and/or starting up a cooling unit in the economizer mode, may result in an undesirable change in humidity that may result in an operator switching the cooling unit to the mechanical mode, and thus not experiencing the efficiency that may be provided by the economizer mode.

The system described herein may provide a cost-effective and efficient solution to utilize the economizer mode of a cooling unit while retaining the appropriate level of humidity in the storage volume of the cool aisles.

Figure 1:
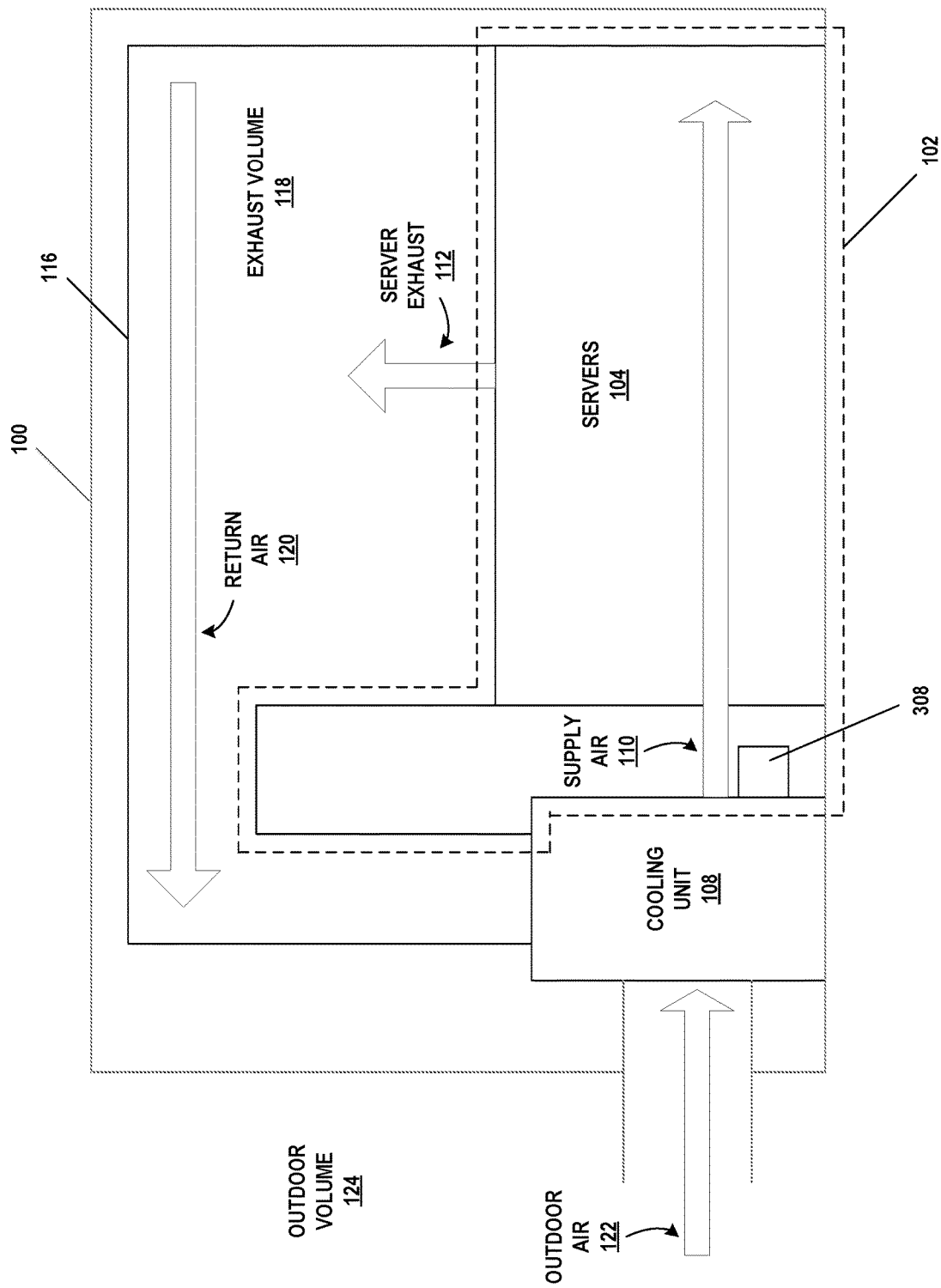
FIG. 1 is a block diagram that illustrates a high-level view of a data center, in accordance with one or more techniques of the disclosure.

FIG. 1 is a block diagram that illustrates a high-level view of a data center, in accordance with one or more techniques of the disclosure. Data center 100 includes storage volume 102 that stores servers 104. Cooling unit 108 cools and supplies supply air 110 to storage volume 102. Server exhaust 112 is released from servers 104. Warm air, including server exhaust 112, in exhaust volume 118 is returned as return air 120 to be cooled and recirculated by cooling unit 108.

Data center 100 may be a facility for storing one or more electronic devices such as servers 104, network and storage gear, as well as power distribution units (PDUs), or any other suitable electronic or supporting devices according to particular needs. Data center 100 may be situated in a stand-alone building used primarily or exclusively for data center 100 or may be situated in a portion of a larger building used for other uses including office space, residential space, retail space, or any other suitable use. Data center 100 may be in an urban, suburban, or rural location or any other suitable location with any suitable climate. Data center 100 may provide an operating environment for co-location, interconnection, and/or other services. For example, data center 100 may provide an operating environment for any number of services that may be categorized according to service types, which may include, for example, applications/software, platforms, infrastructure, virtualization, and servers and data storage. The names of service types are often prepended to the phrase "as-a-Service" such that the delivery of applications/software and infrastructure, as examples, may be referred to as Software-as-a-Service (SaaS) and Infrastructure-as-a-Service (IaaS), respectively.

Storage volume 102 of data center 100 may be used to store servers 104. In addition, storage volume 102 may store network and/or storage gear or any other suitable electronic or supporting devices. Because servers 104 operate more efficiently and/or reliably within a temperature range exceeded by the temperature of heat exhaust produced by servers 104 and/or other devices stored in storage volume 102, it may be desirable to keep air in storage volume 102 within the temperature range. Storage volume 102 may include one or more racks, cabinets, cages, or other storage devices housing servers 104 and/or any other computing equipment. Storage devices for servers 104 may be arranged in rows within storage volume 102. Rows may be positioned between "cold aisles" for supplying cool supply air 110 to servers 104 and "hot aisles" for collecting server exhaust 112 and diverting server exhaust 112 to exhaust volume 118. In the view of FIG. 1, servers 104 are viewed as being located behind a cold aisle for supplying cool supply air 110 and servers 104 are viewed as being located in front of a hot aisle for collecting and diverting server exhaust 112 to exhaust volume 118.

Servers 104 may be systems that respond to requests across a computer network to provide, or help to provide, a network or data service. Each of servers 104 may include one or more processors that execute software that is capable of accepting requests from clients. Requests from clients may be to share data, information, or hardware and software resources. Servers 104 may include one or more of a database server, file server, mail server, print server, web server, gaming server, application server, communication server, compute server, media server, or any other suitable type of server that may be employed by a data center provider or tenant of the data center provider, according to particular needs. Servers 104 may be specialized or general-purpose devices. Servers 104 may represent x86 or other real or general-purpose servers configured to apply and/or offer services to customers. Servers 104 may also include special-purpose appliances or controllers for providing interconnection services between customers of a co-location facility provided by data center 100 or for providing any other suitable services according to particular needs. Servers 104 may use any suitable operating system including Unix-like open source distributions, such as those based on Linux and FreeBSD, Windows Server, or any other suitable operating system.

Server exhaust 112 may be warm air heated by servers 104. As electricity passes across circuits and through wires within servers 104, it may meet a natural degree of resistance. This resistance may create heat. Vents in a chassis of servers 104 and/or server cabinets may allow for the escape of heat from servers 104 resulting in warm server exhaust 112. Vents may be strategically placed to release heat and, therefore, server exhaust 112 in the "hot aisles" described above and to allow for server exhaust 112 to enter exhaust volume 118 for return to cooling unit 108 for cooling and recirculation. Alternatively or in addition, server exhaust 112 may be diverted outside data center 100 through exhaust fans or relief vents in the data center 100 and/or in the unit 108, or to any other suitable location instead of being cooled and recirculated. The amount of heat generated by servers 104, and therefore the amount of server exhaust 112 generated by servers 104, may vary depending on the number, composition, and functions of servers 104. For example, different functions performed by different components within servers 104 may result in different amounts of heat generation.

Supply air 110 may be air that is supplied to storage volume 102 to keep air within storage volume 102 and surrounding servers 104 relatively cool, such that servers 104 may be maintained at a temperature within a preferred operating temperature range for the servers 104. Although described herein as "air," supply air 110 may be any suitable composition of gas for cooling devices within storage volume 102. Supply air 110 may be supplied by cooling return air 120 or any other suitable air source in cooling unit 108 or by drawing air from a source of air that is already cool such as, for example, outdoor air 122 from outdoor volume 124 in a location with a cool climate. For example, for data center 100 in New York in the winter, supply air 110 may be supplied by drawing outdoor air 122 in from outdoor volume 124, outside data center 100.

Cooling unit 108 may be a unit for cooling and circulating cool supply air 110 in storage volume 102. Any suitable number of cooling units 108 may be used to provide cool supply air 110 to storage volume 102. In certain examples, cooling unit 108 may cool air from return air 120 and recirculate it as cool air 110 in storage volume 102. In some cases, cooling unit 108 may draw air from another source, such as outdoor air 122 from air outside data center 100, in outdoor volume 124, to supply as cool supply air 110 in storage volume 102. For example, in certain locations where the climate is relatively cool during at least part of the year, cooling unit 108 may draw outdoor air 122 from outdoor volume 124, outside data center 100, during those parts of the year and may supply that air as cool supply air 110 into storage volume 102. Cooling unit 108 may do this in addition to or alternatively to cooling return air 120 to supply as cool supply air 110. For example, cool supply air 110 may be supplied partly from cooling return air 120 and partly from outdoor air 122 drawn from outdoor volume 124 when outdoor volume 124 has a cool temperature. Cooling unit 108 may alternate from drawing outdoor air 122 from outdoor volume 124 during times of cool outdoor volume 124 temperatures to cooling return air 120 during times of warm outdoor volume 124 temperatures. Alternatively or in addition, cooling unit 108 may, at the same time, use a combination of cooled return air 120 and outdoor air 122 from outdoor volume 124 to supply cool air 110 to storage volume 102. Drawing at least a portion of cool supply air 110 from outdoor volume 124 as outdoor air 122 may increase efficiency by limiting the energy needed to cool sufficient return air 120 to supply cool supply air 110 to storage volume 102. Alternatively or in addition, cooling unit 108 may cool air from a different source than return air 120. For example, cooling unit 108 may draw and cool outdoor air 122 from outdoor volume 124 that may be cooler than return air 120 but not cool enough to supply as cool supply air 110 without cooling by cooling unit 108. Cooling unit 108 may cool air using a refrigeration cycle, evaporation, free cooling, based on desiccants, or in any other suitable manner. When cooling unit 108 supplies cooled supply air 110 exclusively by cooling and recirculating supply air 120, cooling unit 108 is in a mechanical mode. When cooling unit 108 supplies at least a portion of cooled supply air 110 from outdoor air 122, cooling unit 108 is in an economizer mode.

Duct 116 may be a portion of a duct system located above or otherwise proximate to servers 104 and defining exhaust volume 118 to collect server exhaust 112 and return it as return air 120 to the cooling unit 108. Duct 116 may be composed of galvanized steel, aluminum, Polyurethane and phenolic insulation panels, fiberglass duct board, flexible plastic, metal wire coil, aluminum/zinc alloy, multilayer laminate, fibre reinforced polymer, or any other suitable material or combination of materials.

Exhaust volume 118 may be a volume within data center 100 for collecting and returning warm air to the cooling system for cooling and recirculation. For example, server exhaust 112 may be collected in exhaust volume 118. Exhaust volume 118 may be a volume within a duct system including a volume within a plenum for collecting server exhaust 112, power distribution unit (PDU) exhaust, and any other suitable warm air, according to particular needs, and returning it to cooling unit 108 as return air 120, releasing it outside data center 100, or otherwise diverting it in any other suitable manner according to particular needs. All or a portion of exhaust volume 118, including a plenum in exhaust volume 118, may be depressurized to help divert server exhaust 112 into exhaust volume 118 and return it as return air 120 to cooling unit 108 according to particular needs.

Return air 120 may be a stream of air returned to cooling unit 108 for cooling and recirculation. For example, server exhaust 112, as described above, may be collected in exhaust volume 118 and returned to cooling unit 108 as return air 120. Once returned to cooling unit 108, warm return air 120 may be cooled and recirculated in storage volume 102 as cool supply air 110 by cooling unit 108. Return air 120 may be steered to cooling unit 108 by controlling pressure within all or a portion of exhaust volume 118 or by any other suitable manner according to particular needs.

In operation, cooling unit 108 may be started in a mechanical mode in which the cooling unit 108 receives return air 120, cools the return air 120, and releases the cooled return air as supply air 110 to the cooled storage volume 102. After waiting a wait interval, the cooling unit 108 may be transitioned, over a transition interval, from the mechanical mode to an economizer mode in which the cooling unit 108 receives outdoor air 122 and releases the outdoor air 122 as at least a portion of the supply air 110. Transitioning the cooling unit 108 from the mechanical mode to the economizer mode may include transitioning from receiving only the return air 120 to receiving progressively less of the return air 120 and progressively more of the outdoor air 122. The wait interval may be a period during which a media of a humidifier (described in further detail below) of the cooling unit 108 is able to become sufficiently saturated with liquid to support the transitioning of the cooling unit 108 from the mechanical mode to the economizer mode. In some examples, the wait interval may be approximately 30 to 60 minutes, or, more specifically, approximately 45 minutes. In some examples, the wait interval and/or the transition interval may be configurable by an operator.

Starting the cooling unit 108 may include powering on the cooling unit 108, at which time the media of a humidifier of the cooling unit 108 may be dry. In some examples, outdoor air 122 may be relatively dry compared to return air 120 such that starting the cooling unit 108 in an economizer mode and/or switching to an economizer mode abruptly may result in an undesirable drop in humidity of the supply air 110. Starting the cooling unit 108 in the mechanical mode and waiting a wait interval before transitioning to the economizer mode may allow the media to be sufficiently saturated with liquid to support the transition to the economizer mode such that transitioning to the economizer mode does not result in an undesirable drop in humidity of the supply air 110. For example, starting the cooling unit 108 in the economizer mode or transitioning to the economizer mode before the media is sufficiently saturated may result in a drop in humidity of the supply air 110 that is undesirable and may necessitate switching the cooling unit 108 to the mechanical mode, which may not be as efficient as the economizer mode. In addition, transitioning to the economizer mode by transitioning from receiving only the return air 120 to receiving progressively less of the return air 120 and progressively more of the outdoor air 122 over a lengthy interval may avoid an undesirable drop in humidity that may otherwise result if the respective proportions of outdoor air 122 and return air 120 were significantly changed over a short transition interval. For example, transitioning over a short interval may result in a dramatic drop in humidity that may not be correctable without switching back to mechanical mode. Such a drop may necessitate switching the cooling unit 108 to the mechanical mode, which may not be as efficient as the economizer mode. Transitioning over a longer interval may allow for a noticed drop in humidity to be modest and corrected by adjusting the respective proportions of outdoor air 122 and return air 120 to correct the drop in humidity (by, for example, increasing the proportion of return air 120 and decreasing the amount of outdoor air 122 until a satisfactory humidity level is achieved). In the examples described herein, the respective proportions of outdoor air 122 and return air 120 add up to make the whole amount of air used to provide supply air 110 such that, as one increases, the other decreases. In some examples, transitioning over a lengthy time interval may also allow for the humidifier of the cooling unit 108 to adjust over time to support the amount of outdoor air 122 being used as supply air 110. Transitioning over a short period may not allow for the humidifier to make such an adjustment, which may result in an undesirable drop in humidity.

Sensors 308 may include one or more sensors configured to measure any suitable parameters of the data center 100. In some examples, the sensors 308 may include one or more sensors for measuring a humidity level (e.g., relative humidity, dew point, or wet bulb temperature) of the supply air 110, the return air 120 and/or the storage volume 102 and may be located, for example, within the storage volume 102 and/or within the cooling unit 108. In some examples, one or more sensors 308 may be used to measure humidity level of the supply air 110 over time. For example, humidity level of the supply air 110 may be measured during the transitioning of the cooling unit 108 from the mechanical mode to the economizer mode and the transitioning may be controlled based on the measured humidity level. Controlling transitioning of the cooling unit 108 from the mechanical mode to the economizer mode may include monitoring the humidity of the supply air 110 and adjusting the respective proportions of the received return air 120 and the received outdoor air 122. Monitoring the humidity of the supply air 110 and adjusting the respective proportions of the received return air 120 and the received outdoor air 122 may allow the system to achieve a ratio of the received return air 120 and the received outdoor air 122 that allows for sufficient humidity of the supply air 110 while also making efficient use of the economizer mode.

In a further example, the cooling unit 108 may continue to operate in the economizer mode with a ratio of the received return air 120 and the received outdoor air 122 determined to allow for sufficient humidity of the supply air 110 while also making efficient use of the economizer mode. The system may continue to monitor the humidity of the supply air 110 and, if the humidity drops to an unacceptable level, may again adjust the respective proportions of the received return air 120 and the received outdoor air 122 until a satisfactory humidity is reached. The one or more sensors 308 may measure humidity level of the supply air 110 over time and may generate and output one or more signals indicative of the measurements. The signals may be received by the controller 214 and/or one or more other computing devices to monitor the humidity of the supply air 110.

A satisfactory humidity may be one that is within a satisfactory range such that it is above a minimum threshold, below which the humidity in the storage space 102 is too low and thus may compromise the performance of the equipment in storage space 102 or may be below minimum guidelines, and below a maximum threshold, above which the cooling unit 108 may not be operating efficiently because, for example, it is not utilizing enough cool outdoor air 122.

In some examples, one or more sensors may be used to measure humidity level of the supply air 110, storage volume 102, and/or return air 120 and the system may adjust the respective proportions of outdoor air 122 and return air 120 based on the humidity of the supply air 110, the storage volume 102 and/or the return air 120. The choice of the location(s) at which to monitor humidity may be based on multiple factors including the number of cooling units for any given storage volume, the volume of the storage volume, and/or the presence and number of humidity sensors in any of the three identified locations. Additionally, the choice of humidity sensing points may be chosen by trial and error to achieve the best performance results including, for example, stability of operation.

Figure 2:
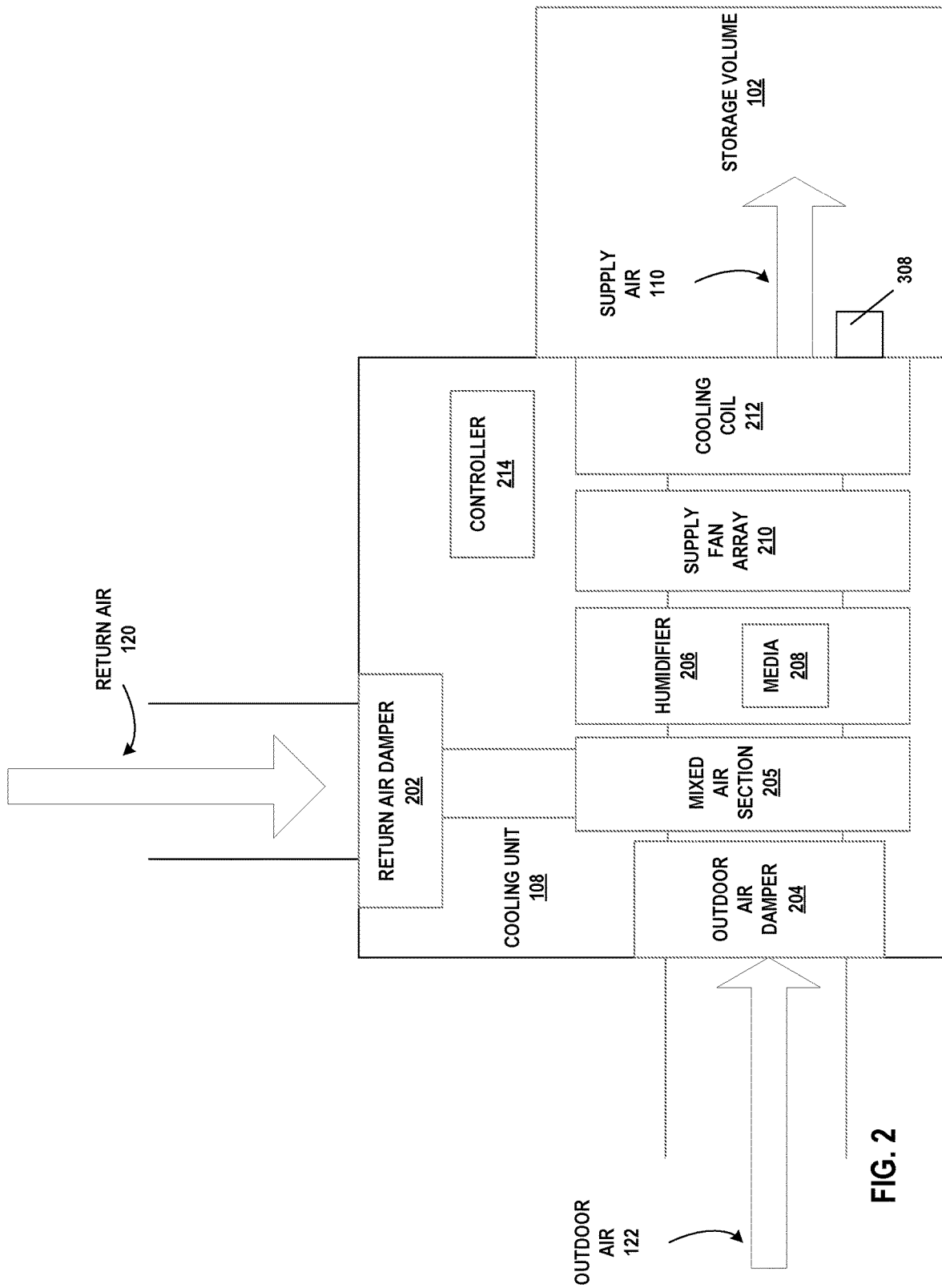
FIG. 2 is a block diagram that illustrates a more detailed view of a portion of the data center of FIG. 1, in accordance with one or more techniques of the disclosure.

FIG. 2 is a block diagram that illustrates a more detailed view of a portion of the data center of FIG. 1, in accordance with one or more techniques of the disclosure. Cooling unit 108 includes a return air damper 202, an outdoor air damper 204, a mixed air section 205, a humidifier 206 including a media 208, a supply fan array 210, and a cooling coil 202.

The return air damper 202 may be a damper used to control the amount of return air 120 supplied to the cooling unit 108. The return air damper 202 may be controlled to increase or decrease an amount of return air 120 from the exhaust volume 118 to the cooling unit 108.

The outdoor air damper 204 may be a damper used to control the amount of outdoor air 122 supplied to the cooling unit 108. The outdoor air damper 204 may be controlled to increase or decrease an amount of outdoor air 122 from the outdoor volume 124 to the cooling unit 108.

Outdoor air 122 (if any) received through outdoor air damper 204 and return air 120 (if any) received through return air damper 202 mix in mixed air section 205. Mixed air section 205 is a substantially enclosed volume that allows mixing of the outdoor air 122 and return air 120 to form mixed air that is the combination of one or more of return air 120 and outdoor air 122 in their respective proportions, prior to the one or more of return air 120 and outdoor air 122 being directed to humidifier 206 by operation of supply fan array 210. If outdoor air damper 204 is closed, the mixed air is substantially return air 120. If return air damper 202 is closed, the mixed air substantially outdoor air 122.

The humidifier 206 may be a component of the cooling unit 108 configured to humidify the collected return air 120 and/or outdoor air 122 such that it is sufficiently humidified to be supplied as supply air 110. For example, the data center 100 may have requirements for a minimum humidity of supply air 110, the storage volume 102 and/or the return air 120 to support proper operation of servers 104 and/or other equipment within the data center 100 and humidity of the return air 120 and/or the outdoor air 122 may need to be increased in order to meet this standard. The humidifier 206 may include a media 208 that may be partially or completely saturated with a liquid, such as water, such that air passing over or through the media 208 may increase in humidity.

Supply fan array 210 may include one or more fans configured to direct air, including one or more of return air 120 and outdoor air 122 through the cooling unit 108 and out of the cooling unit 108 as supply air 110.

Cooling coils 212 may be coils within the cooling unit 108 configured to cool the supply air 110 before it enters the storage volume 102. Cooling coils 212 may employ refrigeration cycle, chilled water, evaporation, free cooling, based on desiccants, or in any other manner of cooling supply air 110.

Controller 214 may a be a for controlling the functions of cooling unit 108 including, for example, the states of outdoor air damper 204 and return air damper 202. For example, the controller 214 may be programmed to adjust the respective proportions of the incoming outdoor air 122 and return air 120 by adjusting positions of the respective damper outdoor air damper 204 and return air damper 202. Outdoor air damper 204 is completely closed when cooling unit 108 is in mechanical mode. Outdoor air damper 204 is at least partially open when cooling unit 108 is in economizer mode.

When the cooling unit 108 is initially started, the controller 214 may control the return air damper 202 to be open the return air damper 202 to a position that allows entry of an amount of return air 120 to provide 100% of the supply air 110. The controller 214 may also start humidifier 206 and the media 208 may begin to be saturated with liquid. After a waiting interval, the controller 214 may control the outdoor air damper 204 and return air damper 202 such that less return air 120 is received and more outdoor air 122 is received. The controller 214 may control the dampers such that the respective proportions of received return air 120 and received outdoor air 122 are adjusted over a transition interval, such that the change is not abrupt and thus avoids an abrupt drop in humidity of the supply air 110, the storage volume 102 and/or the return air 120. The controller 214 may monitor the humidity of the supply air 110, the storage volume 102 and/or the return air 120 by receiving one or more signals from the sensors 308 indicating humidity level measurements of the supply air 110. Based on the monitored humidity, the controller 214 may adjust the respective proportions of received return air 120 and received outdoor air 122 to maintain sufficient humidity of the supply air 110 while making efficient use of the outdoor air 122, which requires less cooling than the return air 120.

More or less cooling and/or humidification may be required of the cooling unit 108 depending on the current operating state. For example, depending on the temperature and humidity of air entering the cooling unit 108, including return air 120 and/or outdoor air 122, more or less cooling and/or humidification may be required.

Figure 3:
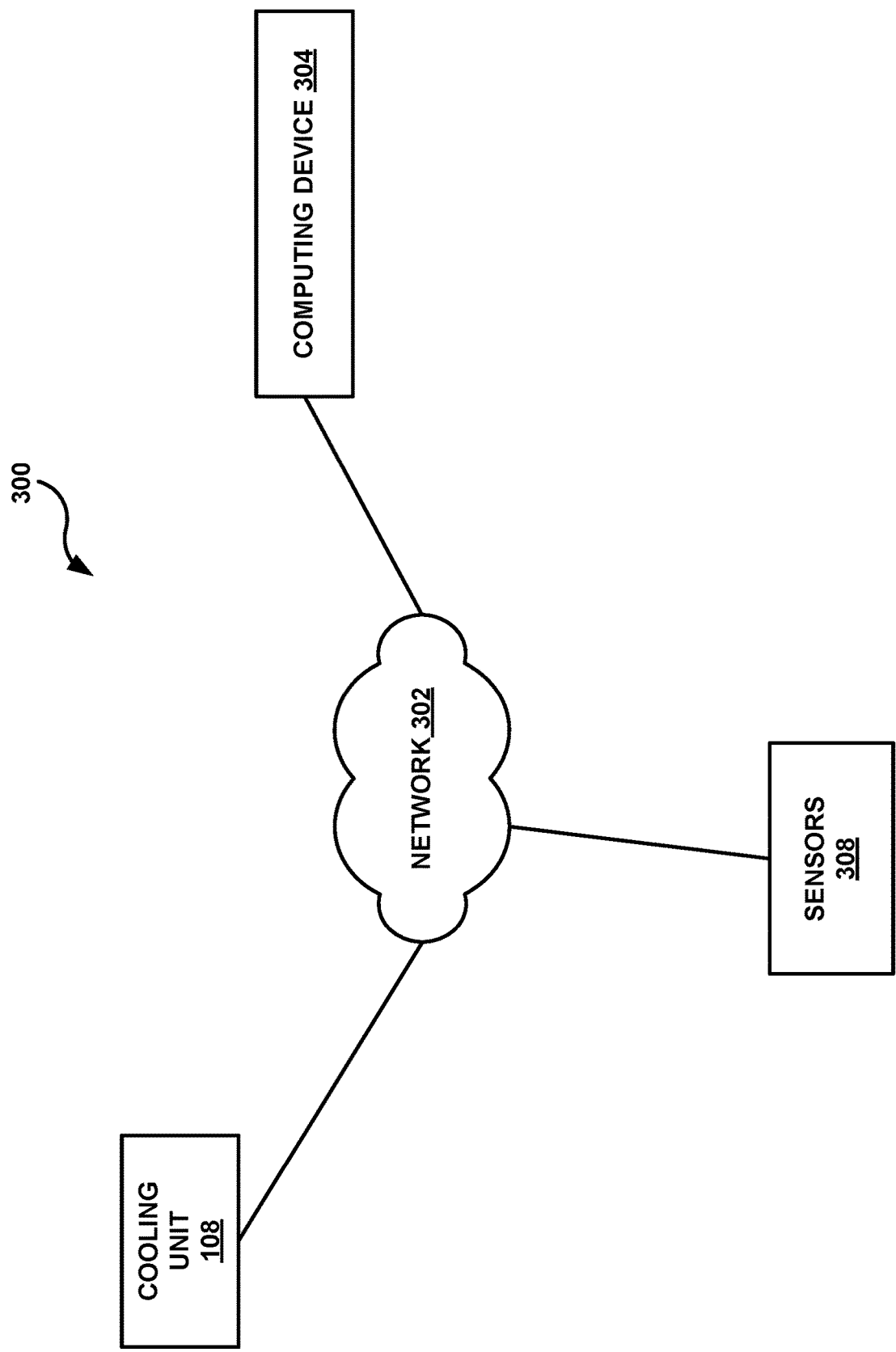
FIG. 3 is a block diagram that illustrates a high-level view of a system for controlling the cooling unit of FIGS. 1 and 2, in accordance with one or more techniques of the disclosure.

FIG. 3 is a block diagram that illustrates a high-level view of a system for controlling the cooling unit 108 of FIGS. 1 and 2, in accordance with one or more techniques of the disclosure. In some examples, the cooling unit 108, as described with respect to FIGS. 1 and 2, may communicate with a computing device 304 and, in some instances, one or more sensors 308 via a network 302. Although described in the following examples as communicating with computing device 304 and one or more sensors 308 via network 302, in some examples, cooling unit 108 may include the computing device 304 and/or one or more of the one or more sensors 308. In some examples, computing device 304 may be the same device as controller 214 such that the computing device is in cooling unit 108. In other examples, computing device 304 may be separate from controller 214 and may be outside of cooling unit 108 and may communicate with controller 214 via network 302 to control cooling unit 108.

Network 302 may comprise a private network associated with data center 100 or may comprise a public network, such as the Internet. Although illustrated as a single entity, network 302 may comprise a combination of networks.

In some examples, computing device 304 may detect indications of one or more humidity measurements at one or more locations received via network 302. Sensors 308 may output such indications using messages that conform to one or more protocols. In some examples, computing device 304 may detect indication of one or more humidity measurements at one or more locations by one or more serial lines or other data lines connecting computing device 304 with sensors 308. Sensors 308 may output such indications using signals, including voltage levels, current levels, or resistance levels, messages that conform to one or more protocols, or other suitable signaling mechanism. In some examples, sensors 308 are integrated within a computing device 304 chassis. In some examples, computing device 304 is integrated within cooling unit 108, e.g., a controller or processor that operates cooling unit 108.

Figure 4:
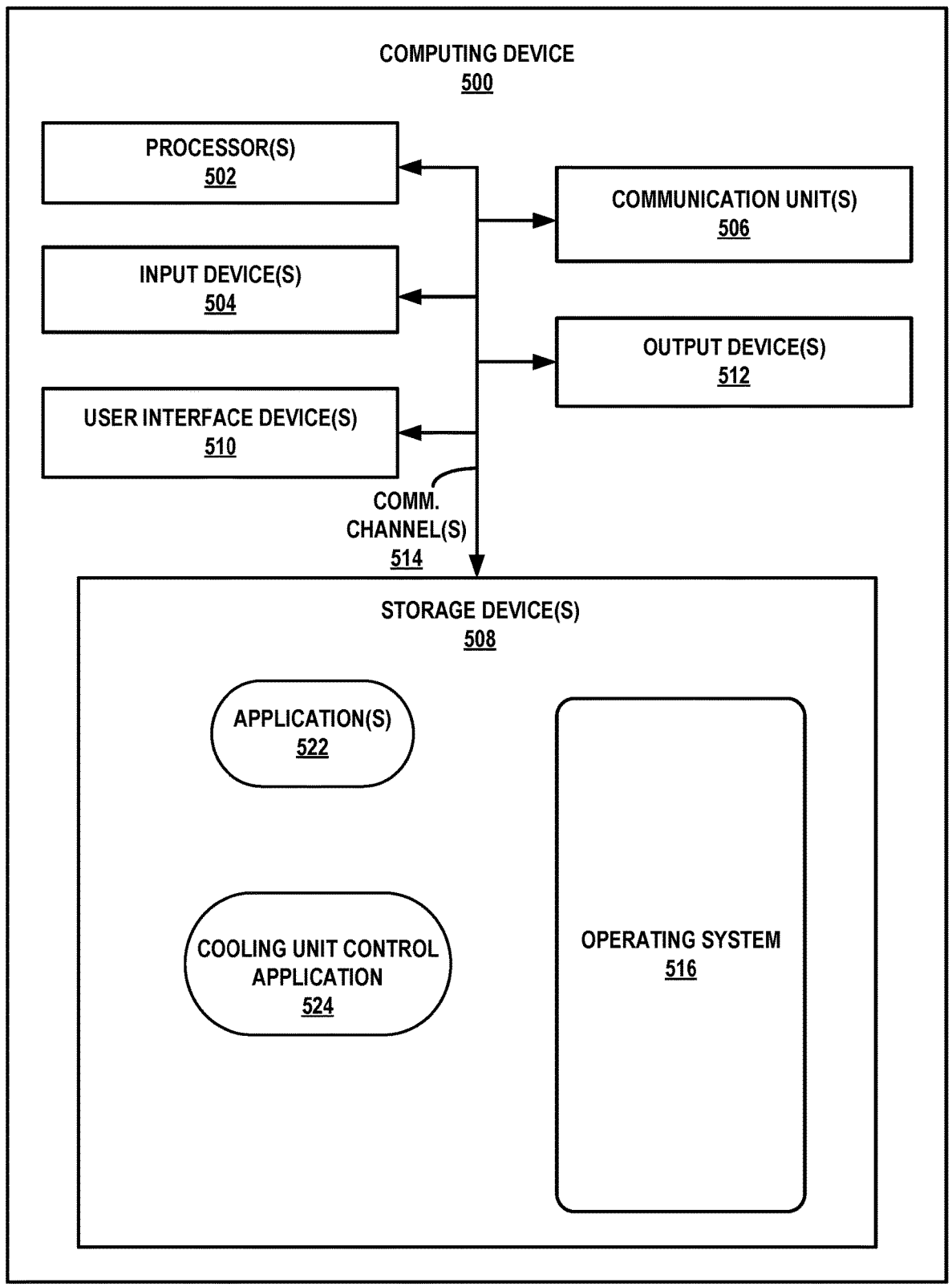
FIG. 4 is a block diagram that illustrates a more detailed view of the computing device of FIG. 3, in accordance with one or more techniques of the disclosure.

FIG. 4 is a block diagram that illustrates, in further detail, an example computing device for controlling the cooling unit 108 of FIGS. 1 and 2, in accordance with one or more techniques of the disclosure. Computing device 500 may represent an example of computing device 304 of FIG. 3. Computing device 500 may include a server or other computing device that includes one or more processor(s) 502 for executing cooling unit control application 524. Other examples of computing device 500 may be used in other instances. Although shown in FIG. 4 as a stand-alone computing device 500 for purposes of example, a computing device may be any component or system that includes one or more processors or other suitable computing environment for executing software instructions and, for example, need not necessarily include one or more elements shown in FIG. 4 (e.g., communication units 506; and in some examples components such as storage device(s) 508 may not be co-located or in the same chassis as other components).

As shown in the specific example of FIG. 4, computing device 500 includes one or more processors 502, one or more input devices 504, one or more communication units 506, one or more output devices 512, one or more storage devices 508, and user interface (UI) device 510, and communication unit 506. Computing device 500, in one example, further includes one or more applications 522, cooling unit control applications 524, and operating system 516 that are executable by computing device 500. Each of components 502, 504, 506, 508, 510, and 512 are coupled (physically, communicatively, and/or operatively) for inter-component communications. In some examples, communication channels 614 may include a system bus, a network connection, an inter-process communication data structure, or any other method for communicating data. Communication may be via one or more communication protocols including ModBus, BacNET, proprietary DDC or PLC manufacturer's protocol, or an open protocol. As one example, components 502, 504, 506, 508, 510, and 512 may be coupled by one or more communication channels 514.

Computing device 500 may be located and execute, for example, within a data center 100 or at another location.

Processors 502, in one example, are configured to implement functionality and/or process instructions for execution within computing device 500. For example, processors 502 may be capable of processing instructions stored in storage device 508. Examples of processors 502 may include, any one or more of a microprocessor, a controller, a digital signal processor (DSP), an application specific integrated circuit (ASIC), a field-programmable gate array (FPGA), or equivalent discrete or integrated logic circuitry.

One or more storage devices 508 may be configured to store information within computing device 500 during operation. Storage device 508, in some examples, is described as a computer-readable storage medium. In some examples, storage device 508 is a temporary memory, meaning that a primary purpose of storage device 508 is not long-term storage. Storage device 508, in some examples, includes volatile memory, meaning that storage device 508 does not maintain stored contents when the computer is turned off. Examples of volatile memories include random access memories (RAM), dynamic random access memories (DRAM), static random access memories (SRAM), and other forms of volatile memories known in the art. In some examples, storage device 508 is used to store program instructions for execution by processors 502. Storage device 508, in one example, is used by software or applications running on computing device 500 to temporarily store information during program execution.

Storage devices 508, in some examples, also include one or more computer-readable storage media. Storage devices 508 may be configured to store larger amounts of information than volatile memory. Storage devices 508 may further be configured for long-term storage of information. In some examples, storage devices 508 include non-volatile storage elements. Examples of such non-volatile storage elements include magnetic hard discs, optical discs, floppy discs, flash memories, or forms of electrically programmable memories (EPROM) or electrically erasable and programmable (EEPROM) memories.

Computing device 500, in some examples, also includes one or more communication units 506. Computing device 500, in one example, utilizes communication units 506 to communicate with external devices via one or more networks, such as one or more wired/wireless/mobile networks. Communication units 506 may include a network interface card, such as an Ethernet card, an optical transceiver, a radio frequency transceiver, or any other type of device that can send and receive information. Other examples of such network interfaces may include 3G and WiFi radios. In some examples, computing device 500 uses communication unit 506 to communicate with an external device.

Computing device 500, in one example, also includes one or more user interface devices 510. User interface devices 510, in some examples, are configured to receive input from a user through tactile, audio, or video feedback. Examples of user interface devices(s) 510 include a presence-sensitive display, a mouse, a keyboard, a voice responsive system, video camera, microphone or any other type of device for detecting a command from a user. In some examples, a presence-sensitive display includes a touch-sensitive screen.

One or more output devices 512 may also be included in computing device 500. Output device 512, in some examples, is configured to provide output to a user using tactile, audio, or video stimuli. Output device 512, in one example, includes a presence-sensitive display, a sound card, a video graphics adapter card, or any other type of device for converting a signal into an appropriate form understandable to humans or machines. Additional examples of output device 512 include a speaker, a cathode ray tube (CRT) monitor, a liquid crystal display (LCD), or any other type of device that can generate intelligible output to a user.

Computing device 500 may include operating system 516. Operating system 516, in some examples, controls the operation of components of computing device 500. For example, operating system 516, in one example, facilitates the communication of one or more applications 522 and cooling unit control applications 524 with processors 502, communication unit 506, storage device 508, input device 504, user interface devices 510, and output device 512.

Application 522 and cooling unit control applications 524 may also include program instructions and/or data that are executable by computing device 500. Cooling unit control application 524 may include instructions for causing computing device to perform one or more of the operations and actions described in the present disclosure with respect to cooling unit 108. As one example, cooling unit control application 524 may include instructions that cause the processor(s) 502 of the computing device 500 to, at a start time, control the cooling unit 108 to start the cooling unit 108 in a mechanical mode in which the cooling unit 108 receives return air 120, cools the return air 120, and releases the cooled return air as supply air 110 to a cooled volume (e.g., cold aisles) of the storage volume 102 and to control the cooling unit 108 to transition, after waiting a waiting interval from the start time and over a transition interval, the cooling unit 108 from the mechanical mode to an economizer mode by transitioning the cooling unit 208, over the transition interval, from receiving only the return air 120 to receiving progressively less of the return air 120 and progressively more of the outdoor air 122.

As another example, cooling unit control application 524 may include instructions that cause the processor(s) 502 of the computing device 500 to monitor a humidity of the supply air 110, the storage volume 102 and/or the return air 120 by receiving one or more signals indicative of one or more humidity level measurements of the supply air 110, return air 120, or storage volume 102 during the transition interval and to controlling the cooling unit 108 to adjust respective proportions of the received return air 120 and the received outdoor air 122 based on the monitored humidity.

For instance, one of input devices 504 may detect a signal indicating a humidity level measurement of supply air 110, return air 120 or storage volume 102. Input devices 504 may in some examples comprise any of sensors 308 described herein. Processors 502 executing cooling unit control application 524 may, in response to the signal, cause output devices 512 to output one or more signals that control a proportion of the received return air 120 and the received outdoor air 122 for supply air 110. For example, output devices 512 may output, via network, one or signals that indicate the respective proportions of the received return air 120 and the received outdoor air 122. The one or more signals may indicate the respective proportions by indicating respective levels for return air dampers 202 and outdoor air dampers 204. The one or more signals may indicate the respective proportions by indicating a ratio of the received return air 120 and the received outdoor air 122.

Figure 5:
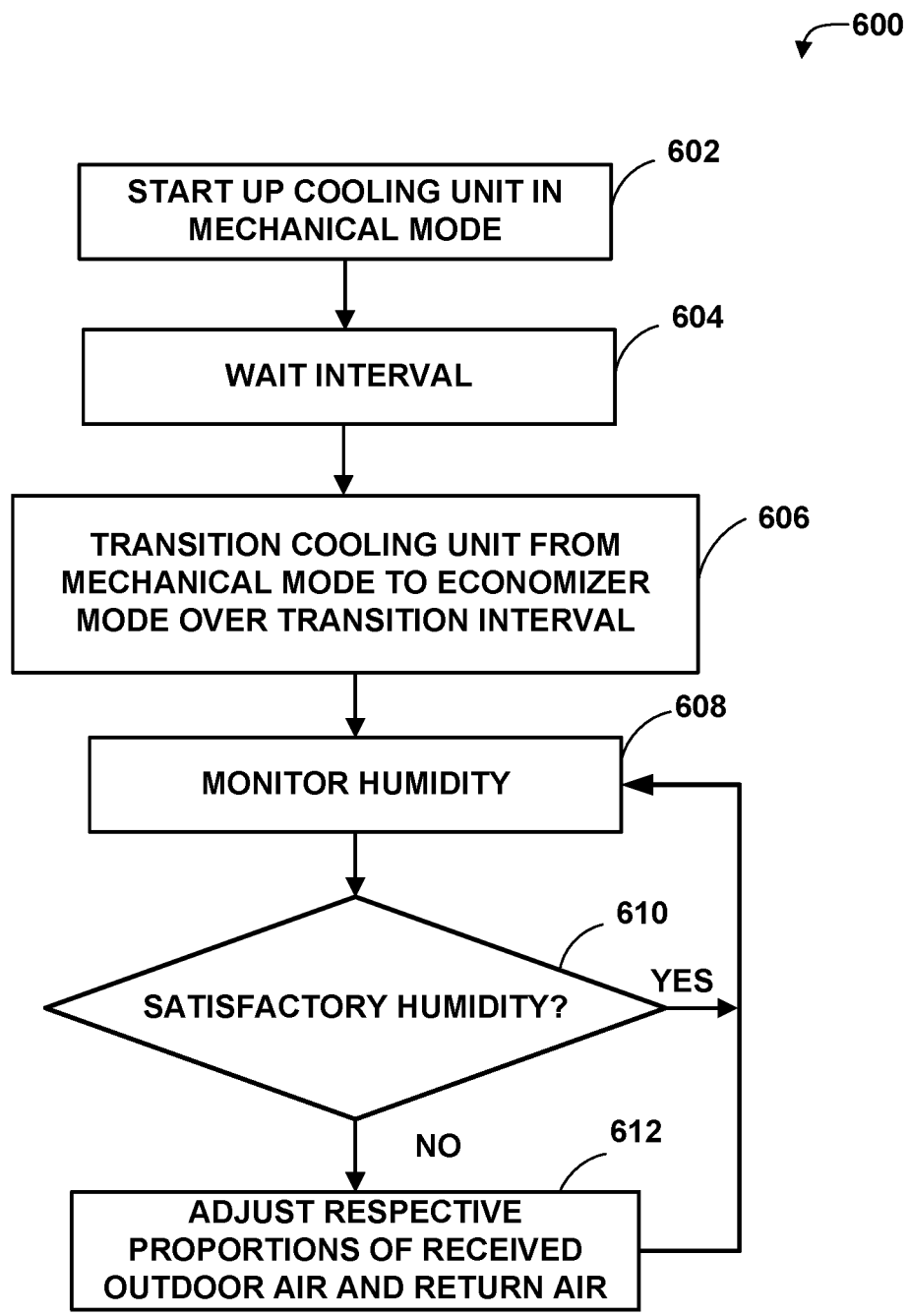
FIG. 5 is a flow diagram illustrating an example method for controlling a cooling unit, in accordance with one or more techniques of the disclosure.

FIG. 5 is a flow diagram illustrating an example method for controlling a cooling unit, in accordance with one or more techniques of the disclosure. Computing device 304 may control the cooling unit 108 to start up the cooling unit 108 in the mechanical mode in which the cooling unit 108 receives return air 120, cools the return air 120, and releases the cooled return air as supply air 110 to the cooled storage volume 102 (602).

Computing device 304 may wait a wait interval (604). The wait interval may be a period during which the media 208 of the humidifier 206 of the cooling unit 108 is able to become sufficiently saturated with liquid to support the transitioning of the cooling unit 108 from the mechanical mode to the economizer mode. In some examples, the wait interval is approximately 30 to 60 minutes. In some examples, the wait interval is approximately 45 minutes.

Computing device 304 may control the cooling unit 108 to transition, after waiting the waiting interval from the start time and over a transition interval, the cooling unit 108 from the mechanical mode to an economizer mode in which the cooling unit 108 receives outdoor air 122 and releases the outdoor air 122 as at least a portion of the supply air 110 (606). Transitioning the cooling unit 108 from the mechanical mode to the economizer mode may include transitioning from receiving only the return air 120 to receiving progressively less of the return air 120 and progressively more of the outdoor air 122. For example, the computing device 304 may be configured to transition the cooling unit 108 from the mechanical mode to an economizer mode by controlling one or more of return air damper 202 and the outdoor air damper 204 of the cooling unit 108 to, e.g., progressively close return air damper 202 and progressively open outdoor air damper 204.

Computing device 304 may monitor a humidity of the supply air 110, the storage volume 102 and/or the return air 120 (608). For example, computing device 304 may receive one or more signals indicative of one or more humidity level measurements of the supply air 110, the storage volume 102 and/or the return air 120 during the transition interval and/or at other times during the operation of the cooling unit 108.

Computing device 304 may determine whether the supply air 110, the storage volume 102 and/or the return air 120 is at a satisfactory humidity (610). For example, the computing device 304 may determine whether the supply air 110, the storage volume 102 and/or the return air 120 is at a satisfactory humidity that also allows for the efficient use of outdoor air 122. Such humidity may be, for example, at or above a minimum threshold humidity. The computing device 304 may be configured to optimize the performance of the cooling unit 108 by achieving a minimum acceptable humidity level such that the humidity is sufficient to support the operation of the data center 100 and is also efficient. If the computing device 304 determines that the humidity is satisfactory, the computing device 304 may continue to monitor humidity (608) and determine whether the humidity is satisfactory (610).

If the computing device 304 determines that the humidity is not satisfactory, the computing device 304 may control the cooling unit 108 to adjust the respective proportions of the received outdoor air 122 and received return air 120 (612). For example, the computing device 304 may adjust the respective proportions by controlling the outdoor air damper 204 and/or the return air damper 202. In some examples, the computing device 304 may control the cooling unit 108 to increase the proportion of the received return air 120 and decrease the proportion of the received outdoor air 122 to increase the humidity of the supply air 110, the storage volume 102 and/or the return air 120 if, for example, the monitored humidity is below an acceptable threshold for the performance of the data center 100. In some examples, the computing device 304 may control the cooling unit 108 to decrease the proportion of the received return air 120 and increase the proportion of the received outdoor air 122 to decrease the humidity of the supply air 110, the storage volume 102 and/or the return air 120 if, for example, the humidity is above a maximum threshold such that the cooling unit 108 is not making efficient use of cool outdoor air 122.

The computing device 304 may continue to monitor the humidity of the supply air 110, the storage volume 102 and/or the return air 120 (608) and, as needed, adjust the respective proportions of the received outdoor air 122 and received return air 120 (612) such that the humidity of the supply air 110, the storage volume 102 and/or the return air 120 stays at an acceptable level.

In some examples, modulation of the outside air damper 204 and/or the return air damper 202 may be controlled to maintain a mixed air set point downstream of the humidifier 206. This may allow for satisfactory cooling by the humidifier 206 to be taken into account, which may allow for more accurate control. It may also allow the cooling to be controlled based on temperature of the supply air 110 and/or other air within the storage volume 102.

In some examples, the mixed air temperature set point for the damper control may be the temperature set point of supply air 110 minus an adjustable offset (for example, about 2 degrees Fahrenheit). Using the mixed air temperature for economizer control and the supply air temperature for the cooling control with the offset applied may decouple the economizer and cooling operations while continually satisfying the data center cooling needs. It may also prevent the two cooling stages from interfering with each other.

In some examples, the control of the dampers based on humidity may be an override feature that only occurs when the respective humidity drops below a set point. Once the humidity set point is satisfied, the override may be released and the standard economizer controls may resume modulation of the dampers.

The techniques described herein may be implemented in hardware, software, firmware, or any combination thereof. Various features described as modules, units or components may be implemented together in an integrated logic device or separately as discrete but interoperable logic devices or other hardware devices. In some cases, various features of electronic circuitry may be implemented as one or more integrated circuit devices, such as an integrated circuit chip or chipset.

If implemented in hardware, this disclosure may be directed to an apparatus such as a processor or an integrated circuit device, such as an integrated circuit chip or chipset. Alternatively or additionally, if implemented in software or firmware, the techniques may be realized at least in part by a computer-readable data storage medium comprising instructions that, when executed, cause a processor to perform one or more of the methods described above. For example, the computer-readable data storage medium may store such instructions for execution by a processor.

A computer-readable medium may form part of a computer program product, which may include packaging materials. A computer-readable medium may comprise a computer data storage medium such as random access memory (RAM), read-only memory (ROM), non-volatile random access memory (NVRAM), electrically erasable programmable read-only memory (EEPROM), Flash memory, magnetic or optical data storage media, and the like. In some examples, an article of manufacture may comprise one or more computer-readable storage media.

In some examples, the computer-readable storage media may comprise non-transitory media. The term "non-transitory" may indicate that the storage medium is not embodied in a carrier wave or a propagated signal. In certain examples, a non-transitory storage medium may store data that can, over time, change (e.g., in RAM or cache).

The code or instructions may be software and/or firmware executed by processing circuitry including one or more processors, such as one or more digital signal processors (DSPs), general purpose microprocessors, application-specific integrated circuits (ASICs), field-programmable gate arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, functionality described in this disclosure may be provided within software modules or hardware modules.

Various embodiments have been described. These and other embodiments are within the scope of the following examples.

What is claimed is:

1. A method comprising:
    at a start time, by a computing device, controlling a cooling unit to start the cooling unit in a mechanical mode in which the cooling unit receives return air, cools the return air, and releases the cooled return air as supply air, the supply air being air supplied to a cooled volume; and
    controlling, by the computing device, the cooling unit to transition, after waiting a wait interval from the start time and over a transition interval, the cooling unit from the mechanical mode to an economizer mode in which the cooling unit receives outdoor air and releases the outdoor air as at least a portion of the supply air, wherein transitioning the cooling unit from the mechanical mode to the economizer mode includes transitioning, over the transition interval, from receiving only the return air to receiving progressively less of the return air and progressively more of the outdoor air the transition interval being either a configurable interval or based on the humidity of the supply air to transition the cooling unit from the mechanical mode to the economizer mode without resulting in a humidity of the supply air dropping below a minimum threshold.

2. The method of claim 1, wherein the wait interval is a period during which a humidifier media of the cooling unit is able to become saturated with liquid to support the transitioning of the cooling unit from the mechanical mode to the economizer mode without resulting in a humidity of the supply air dropping below a minimum threshold.

3. The method of claim 1, wherein the wait interval is approximately 45 minutes.

4. The method of claim 1, wherein the wait interval is approximately 30 to 60 minutes.

5. The method of claim 1, further comprising:
    monitoring, by the computing device, a humidity of at least one of the supply air, the cooled volume, and the return air by receiving one or more signals indicative of one or more humidity level measurements of the at least one of the supply air, the cooled volume, and the return air during the transition interval; and
    controlling, by the computing device, the cooling unit to adjust respective proportions of the received return air and the received outdoor air based on the humidity.

6. The method of claim 5, wherein controlling the cooling unit to adjust respective proportions of the received return air and the received outdoor air comprises controlling one or more dampers of the cooling unit.

7. The method of claim 5, wherein controlling the cooling unit to adjust the respective proportions of the received return air and the received outdoor air based on the monitored humidity comprises controlling the cooling unit to adjust respective proportions of the received return air and the received outdoor air to maintain a humidity of the at least one of the supply air, the cooled volume, and the return air above a minimum threshold and below a maximum threshold.

8. The method of claim 7, wherein controlling the cooling unit to adjust the respective proportions of the received return air and the received outdoor air to maintain the humidity of the at least one of the supply air, the cooled volume, and the return air above a minimum threshold and below a maximum threshold comprises increasing the proportion of the received return air and decreasing the proportion of the received outdoor air to increase the humidity of the at least one of the supply air, the cooled volume, and the return air.

9. The method of claim 7, wherein controlling the cooling unit to adjust the respective proportions of the received return air and the received outdoor air to maintain the humidity of the at least one of the supply air, the cooled volume, and the return air above a minimum threshold and below a maximum threshold comprises decreasing the proportion of the received return air and increasing the proportion of the received outdoor air to decrease the humidity of the at least one of the supply air, the cooled volume, and the return air.

10. A system comprising:
    a cooling unit comprising a humidifier and cooling coils, the cooling coils for cooling air supplied to a cooled volume;
    a humidity sensor configured to measure humidity of supply air;
    a computing device comprising processing circuitry, the computing device configured to:
        at a start time, control the cooling unit to start the cooling unit in a mechanical mode in which the cooling unit receives return air, cools the return air, and releases the cooled return air as the supply air, the supply air being air supplied to the cooled volume; and
        control the cooling unit to transition, after waiting a wait interval from the start time and over a transition interval, the cooling unit from the mechanical mode to an economizer mode in which the cooling unit receives outdoor air and releases the outdoor air as at least a portion of the supply air, wherein transitioning the cooling unit from the mechanical mode to the economizer mode includes transitioning, over the transition interval, from receiving only the return air to receiving progressively less of the return air and progressively more of the outdoor air, the transition interval being either a configurable interval or based on the humidity of the supply air to transition the cooling unit from the mechanical mode to the economizer mode without resulting in a humidity of the supply air dropping below a minimum threshold.

11. The system of claim 10, wherein the wait interval is a period during which a humidifier media of the cooling unit is able to become saturated with liquid to support the transitioning of the cooling unit from the mechanical mode to the economizer mode.

12. The system of claim 10, wherein the wait interval is approximately 45 minutes.

13. The system of claim 10, wherein the wait interval is approximately 30 to 60 minutes.

14. The system of claim 10, the system further comprising second humidity sensors, wherein the computing device is further configured to:
- monitor the humidity of the supply air with the humidity sensor and a humidity of at least one of the cooled volume and the return air with respective ones of the second humidity sensors by receiving signals from the second humidity sensors and the humidity sensor, the signals being indicative of humidity level measurements of the supply air and the at least one of the cooled volume and the return air during the transition interval; and
- control the cooling unit to adjust respective proportions of the received return air and the received outdoor air based on the humidity.

15. The system of claim 14, wherein the computing device is configured to control the cooling unit to adjust respective proportions of the received return air and the received outdoor air comprises controlling one or more dampers of the cooling unit.

16. The system of claim 14, wherein to control the cooling unit to adjust respective proportions of the received return air and the received outdoor air based on the humidity, the computing device is configured to control the cooling unit to adjust respective proportions of the received return air and the received outdoor air to maintain a humidity of the at least one of the supply air, the cooled volume, and the return air above a minimum threshold and below a maximum threshold.

17. A system comprising:
- a data center storage volume comprising a cooled volume;
- a cooling unit comprising a humidifier and cooling coils, the cooling coils for cooling air supplied to the cooled volume;
- a humidity sensor; and
- a computing device comprising processing circuitry, the computing device configured to:
  - at a start time, control a cooling unit to start the cooling unit in a mechanical mode in which the cooling unit receives return air, cools the return air, and releases the cooled return air as supply air, the supply air being air supplied to the cooled volume; and
  - control the cooling unit to transition, after waiting a wait interval from the start time and over a transition interval, the cooling unit from the mechanical mode to an economizer mode in which the cooling unit receives outdoor air and releases the outdoor air as at least a portion of the supply air, wherein transitioning the cooling unit from the mechanical mode to the economizer mode includes transitioning, over the transition interval, from receiving only the return air to receiving progressively less of the return air and progressively more of the outdoor air, the transition interval being either a configurable interval or based on the humidity of the supply air to control a drop of humidity in the cooling unit as the cooling unit transitions from the mechanical mode to the economizer mode without resulting in a humidity of the supply air dropping below a minimum threshold.

18. The system of claim 17, wherein the wait interval is a period during which a humidifier media of the cooling unit is able to become saturated with liquid to support the transitioning of the cooling unit from the mechanical mode to the economizer mode.

19. The system of claim 17, wherein the wait interval is approximately 45 minutes.

20. The system of claim 17, wherein the wait interval is approximately 30 to 60 minutes.

* * * * *